(12) United States Patent
Hay (10) Patent No.: US 9,464,480 B2
(45) Date of Patent: Oct. 11, 2016

(54) MAGNETOSTRICTIVE MOTOR FOR A BOREHOLE ASSEMBLY

(75) Inventor: Richard Thomas Hay, Spring, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 321 days.

(21) Appl. No.: 14/002,802

(22) PCT Filed: Mar. 7, 2012

(86) PCT No.: PCT/US2012/027964
§ 371 (c)(1),
(2), (4) Date: Sep. 3, 2013

(87) PCT Pub. No.: WO2012/122211
PCT Pub. Date: Sep. 13, 2012

(65) Prior Publication Data
US 2013/0333947 A1  Dec. 19, 2013

Related U.S. Application Data (60) Provisional application No. 61/451,244, filed on Mar. 10, 2011.

(51) Int. Cl.
| | | |
|---|---|---|
| *E21B 7/06* | (2006.01) | |
| *E21B 4/04* | (2006.01) | |
| *H01L 41/12* | (2006.01) | |
| *H02N 2/10* | (2006.01) | |
| *H02N 2/12* | (2006.01) | |

(52) U.S. Cl.
CPC . *E21B 4/04* (2013.01); *E21B 7/06* (2013.01); *E21B 7/068* (2013.01); *H01L 41/12* (2013.01); *H02N 2/10* (2013.01); *H02N 2/105* (2013.01); *H02N 2/123* (2013.01)

(58) Field of Classification Search
CPC .................................. E21B 4/04; E21B 7/068
See application file for complete search history.

(56) References Cited

U.S. PATENT DOCUMENTS

| | | | |
|---|---|---|---|
| 4,498,032 A | 2/1985 | Pinson | |
| 5,341,056 A | 8/1994 | Maccabee | |
| 6,664,710 B1 | 12/2003 | Gottlieb et al. | |
| 7,436,090 B1 | 10/2008 | Brady et al. | |
| 2007/0205022 A1* | 9/2007 | Treviranus | E21B 7/06 175/61 |
| 2008/0179098 A1 | 7/2008 | Hall et al. | |
| 2010/0127582 A1† | 5/2010 | Nair | |
| 2010/0133937 A1† | 6/2010 | Nair | |

FOREIGN PATENT DOCUMENTS

| | | |
|---|---|---|
| EP | 0449048 A1 | 10/1991 |
| GB | 2344223 A | 5/2000 |
| WO | 2008/076625 A2 | 6/2008 |

OTHER PUBLICATIONS

International Preliminary Report on Patentability, International Application No. PCT/US2011/025229, mailed Sep. 19, 2013, 7 pages.
International Search Report and Written Opinion, International Application No. PCT/US2012/027964, pgs., Jul. 16, 2012.

\* cited by examiner
† cited by third party

*Primary Examiner* — William P Neuder
(74) *Attorney, Agent, or Firm* — Alan Bryson; Baker Botts L.L.P.

(57) ABSTRACT

A motor includes: a rotor including an undulated surface; a rod disposed about the rotor; and a coil disposed about the rod to induce shape changes in the rod, which in turn impart forces to the undulated surface to rotate the rotor.

16 Claims, 5 Drawing Sheets

MAGNETOSTRICTIVE MOTOR FOR A BOREHOLE ASSEMBLY

CROSS-REFERENCE TO RELATED APPLICATIONS

This application is a U.S. National Stage Application of International Application No. PCT/US2012/027964 filed Mar. 7, 2012, which claims the benefit of U.S. Provisional Application No. 61/451,244, which was filed Mar. 10, 2011, and which are hereby incorporated by reference in their entirety.

BACKGROUND

The present disclosure relates generally to wellbore operations and, more particularly, to magnetostrictive motors for borehole assemblies.

In general, conventional motors for borehole assemblies are powered by fluid hydraulics. As wells are drilled deeper and deeper, pressure loss over the drill string can dramatically reduce hydraulic power available for cuttings removal and powering a mud motor. This limits available torque output for the mud motor and reduces a speed at which a well can be drilled. Further, downhole temperatures can at times exceed limits of rubber-based hydraulic power sections as found in positive displacement motors. And such rubber can be reactive to various mud types, mud additives, or mud contaminates that cause the rubber-based hydraulic power sections to swell, weaken and/or break as a result of reactions to a chemistry of the fluid with which it is in contact. This then limits a run life of a conventional motor and can dramatically affect the conventional motor reliability, thereby costing a great deal more in lost rig time while tripping out of a hole to change out a failed mud motor for a new one. Therefore, what is needed in the art is an improved motor for borehole assemblies.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features.

While embodiments of this disclosure have been depicted and described and are defined by reference to exemplary embodiments of the disclosure, such references do not imply a limitation on the disclosure, and no such limitation is to be inferred. The subject matter disclosed is capable of considerable modification, alteration, and equivalents in form and function, as will occur to those skilled in the pertinent art and having the benefit of this disclosure. The depicted and described embodiments of this disclosure are examples only, and not exhaustive of the scope of the disclosure.

DETAILED DESCRIPTION

The present disclosure relates generally wellbore operations and, more particularly, to magnetostrictive motors for borehole assemblies.

Illustrative embodiments of the present invention are described in detail herein. In the interest of clarity, not all features of an actual implementation may be described in this specification. It will of course be appreciated that in the development of any such actual embodiment, numerous implementation specific decisions must be made to achieve the specific implementation goals, which will vary from one implementation to another. Moreover, it will be appreciated that such a development effort might be complex and time consuming, but would nevertheless be a routine undertaking for those of ordinary skill in the art having the benefit of the present disclosure.

To facilitate a better understanding of the present invention, the following examples of certain embodiments are given. In no way should the following examples be read to limit, or define, the scope of the invention. Embodiments of the present disclosure may be applicable to horizontal, vertical, deviated, or otherwise nonlinear wellbores in any type of subterranean formation. Embodiments may be applicable to injection wells as well as production wells, including hydrocarbon wells. Devices and methods in accordance with certain embodiments may be used in one or more of wireline, measurement-while-drilling (MWD) logging-while-drilling (LWD) operations and well bore drilling and reaming tools.

In certain embodiments according to the present disclosure, magnetostrictive technology may be capable of generating mechanical energy for use in a motor of a borehole assembly. Magnetostrictive materials have the property that, when magnetic fields are induced in the material, a change in linear dimensions is produced in the material. In other words, rotating magnetic domains can deform the material. A suitable material for the magnetostrictive material may be Terfenol-D, available from Etrema Products, Inc. Various materials, e.g., iron and iron alloys such as Terfenol, may provide suitable magnetostrictive and giant magnetostrictive responses. A magnetic field may be applied to these materials, e.g., by applying an electric current to a coil surrounding the material or to a loop anywhere else in the magnetic circuit.

Certain embodiments according to the present disclosure may provide for a magnetostrictive motor that rotates eccentric rings. By way of non-limiting example, such a magnetostrictive motor may be implemented in a bias unit of a rotary steerable tool. Certain embodiments may provide for a magnetostrictive motor to create a downhole torque for drilling. Certain embodiments may provide for a magnetostrictive motor as a bottom hole assembly orientor. Certain embodiments may provide for a magnetostrictive motor to create a downhole torque to orient a multi-lateral pre-milled window such that it is oriented in the desired direction for exiting the main bore into the lateral with the bit on a whip stock. However, certain embodiments of the magnetostrictive rod motor may be used in other applications where rotational power via electric current is needed.

Figure 1:
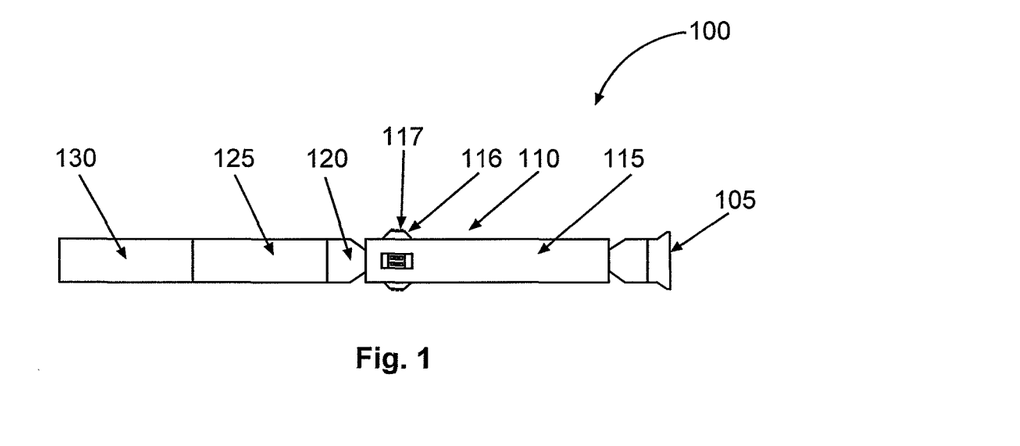
FIGS. 1-4 are diagrams of exemplary rotary steerable bottom hole assemblies, in accordance with certain embodiments of the present disclosure.
Figure 2:
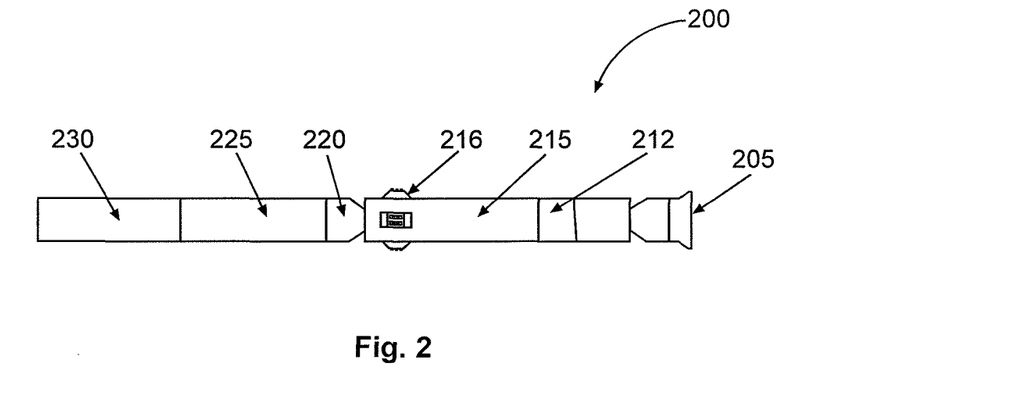
Figure 3:
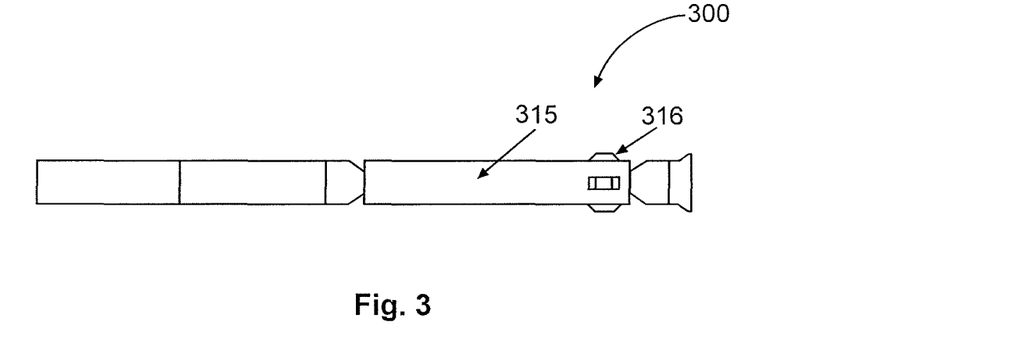

FIGS. 1, 2, and 3 show various exemplary rotary steerable borehole assemblies, in accordance with certain embodiments of the present disclosure. FIG. 1 shows a general layout of an exemplary bottom hole assembly 100 with a drill bit 105, a rotary steerable tool 110 utilizing a rotation-resistant housing 115, a drive sub 120, a measuring-while-drilling (MWD) and/or logging-while-drilling (LWD) section 125, and a telemetry sub 130 to communicate with the surface. The rotation-resistant housing 115 may be prevented from freely rotating by one or more spring-loaded carriages 116. One or more wheels 117 resting in a spring-loaded carriage 116 may be pressed against a borehole wall (not shown) to brace the housing 115 against the borehole wall.

A series of inside shafts (not shown) may run the length of the borehole assembly 100. At the top of the rotation-resistant housing 115, the shaft inside the housing may be connected to the shaft inside the drive sub 120. At the bottom of the rotation-resistant housing 115, the shaft inside the housing may be connected to the shaft inside drill bit 105. Mud may flow inside one or more shafts. Mud may also flow between a shaft and a housing at various points along the length of the inside shaft if so desired.

A power supply (not shown) may be placed inside the rotation-resistant housing 115 between the inside shaft and the outside of the housing. The power supply may be placed in a portion of the housing that is not easily prone to bending as a result of the bowing, flexing or pivoting of the shaft at the lower end of the assembly 100. Such bowing, flexing, or pivoting at the lower end of the shaft at the lower end of the assembly 100 allows for the steering direction of the assembly to change in a desired direction.

FIG. 2 shows a general layout of a rotary steerable borehole assembly 200 with a drill bit 205, a rotation-resistant housing 210, an adjustable joint 212, a drive sub 220, a MWD and/or LWD section 225, and a telemetry sub 230 to communicate with the surface. The rotation-resistant housing 210 may be prevented from freely rotating by one or more adjustable pads 216.

Adjustable pads 216 may be arranged around the outer surface of the rotation-resistant housing 215. In certain embodiments, the adjustable pads 216 may extend outward and away from the housing to engage the wall of the wellbore. In certain embodiments, the adjustable pads 216 include a piston that extends outward to engage the wall of the wellbore. In certain embodiments, the adjustable pads 216 may include ribs that pivot or rotate to engage the wall of the wellbore.

A series of inside shafts (not shown) may run the length of the bottom hole assembly 200. At the top of the rotation-resistant housing 215, the shaft inside the housing may be connected to the shaft inside the drive sub 220. One or more shafts inside the housing 215 may be connected to the shaft inside drill bit 105 via the adjustable joint 212. As described previously, mud may flow inside one or more shafts and/or between a shaft and a housing.

FIG. 3 shows a layout of a bottom hole assembly 300 similar to the bottom hole assemblies 100 and 200, but with carriages/pads 316 at the lower end of a rotation resistant housing 315. It should be understood that the examples of FIGS. 1, 2, and 3 are not limiting. Embodiments of the present disclosure may have other rotary steerable tool configurations. In each of various configurations, an electrical power supply may be found in a housing at any suitable location.

Figure 4:
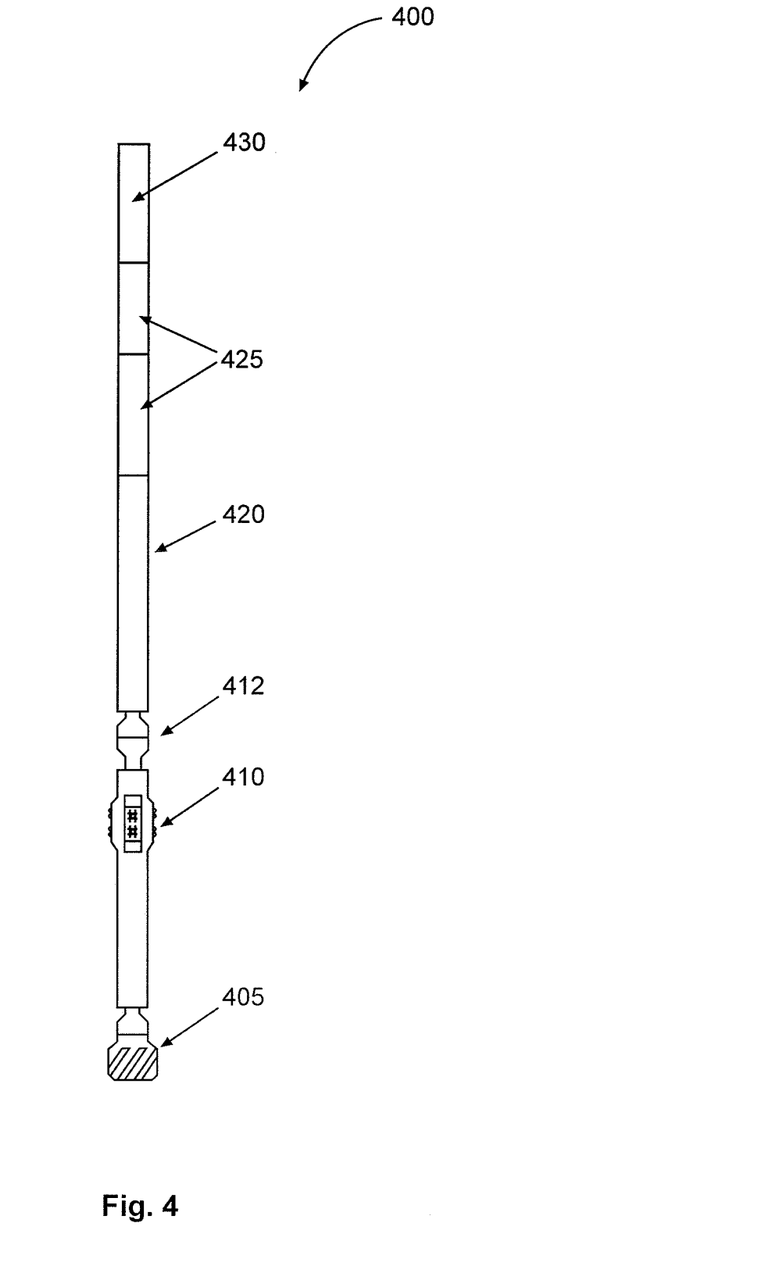

FIG. 4 shows a layout of a rotary steerable bottom hole assembly 400, in accordance with certain embodiments of the present disclosure. The bottom hole assembly 400 may include a drill bit 405, a rotary steerable tool 410, a shaft coupling 412, a drive sub 420, MWD/LWD sensors 425, and a telemetry module 430 to communicate with the surface. In the borehole assembly 400, rotational drive may be provided via a motor in the drive sub 420 above the rotary steerable section 410. In certain example embodiments, the rotary steerable is driven by one or more of a mud motor (e.g., a positive displacement motor), a turbine or vane motor, and an electric motor; and rotational energy may be provided, for example, by the surface drilling rig with the top drive or rotary table.

Figure 5A:
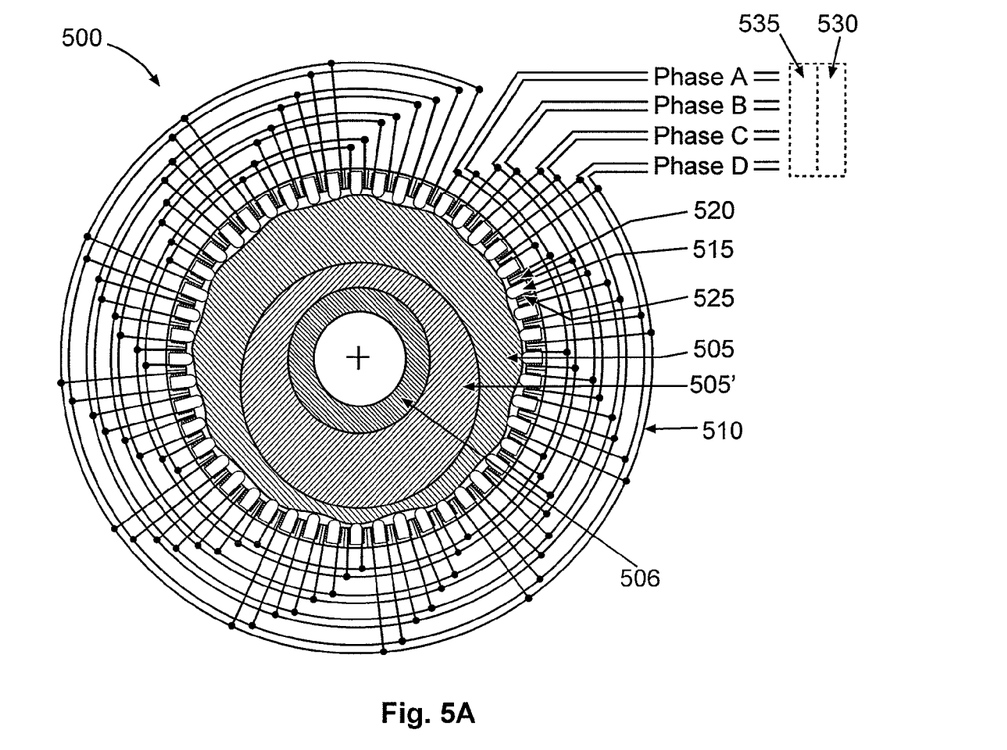
FIG. 5A is a partial cross-sectional diagram of a 4-phase winding magnetostrictive motor, in accordance with certain exemplary embodiments of the present disclosure.
Figure 8:
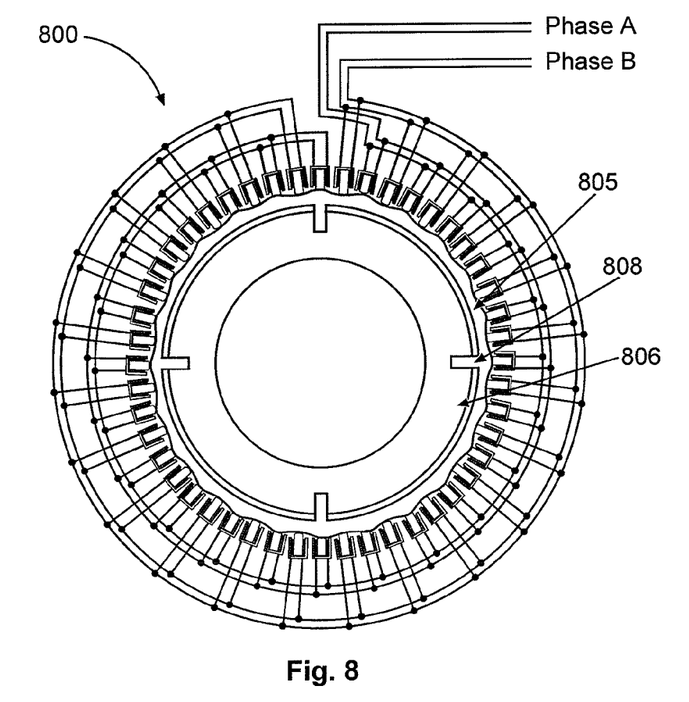
FIG. 8 is a partial cross-sectional diagram of a 2-phase winding magnetostrictive motor, in accordance with certain exemplary embodiments of the present disclosure.

FIG. 5A shows a partial cross-sectional diagram of a 4-phase winding magnetostrictive motor 500, in accordance with certain exemplary embodiments of the present disclosure. While the example quadrature 4-phase motor 500 may be depicted, it should not be understood as limiting. In certain alternative embodiments, the motor may have 3-phase configuration or a configuration having any other suitable number of phases. For example, FIG. 8 shows a partial cross-sectional diagram of a 2-phase winding magnetostrictive motor 800, in accordance with certain exemplary embodiments of the present disclosure. In other respects, the motor 800 is similar to the motor 500 which will now be described in more detail.

Referring again to FIG. 5A, the motor 500 may include a rotor with a multi-lobed cam 505. As depicted, the cam rotor 505 may be connected to a shaft 506. The cam rotor 505 may be connected to the shaft 506 in any suitable manner. As depicted, the cam rotor 505 may be coupled with a magnetostrictive rod assembly 510 that includes a 4-phase winding arrangement. For simplicity, the magnetostrictive rod assembly 510 may be referenced herein as the stator to indicate that it remains stationary. And, the cam 505 may be referenced herein as the rotor due to its movement. However, it should be understood that motion is relative and, thus, the convention of which is the rotor or stator may be interchangeable.

Figure 5B:
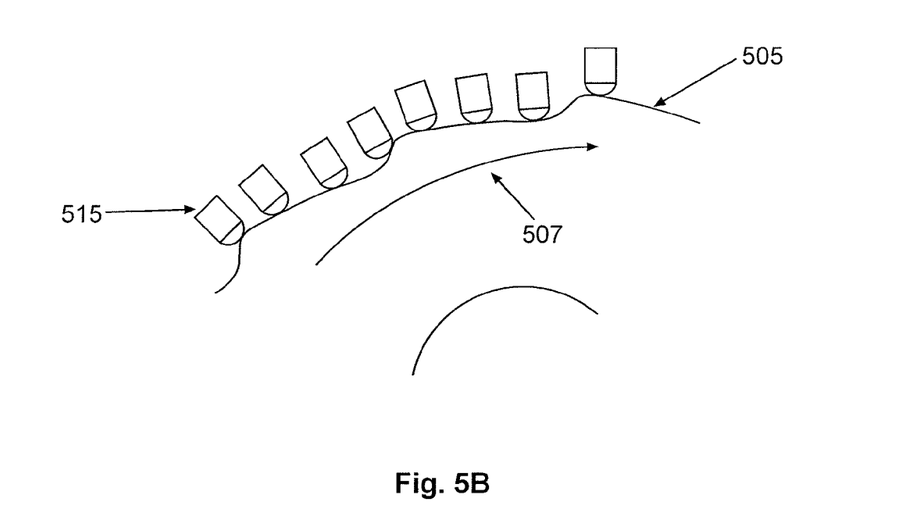
FIG. 5B is a diagram illustrating one example of a cam rotor having a skewed pattern, in accordance with certain exemplary embodiments of the present disclosure.

As depicted in FIG. 5A, the cam rotor 505 may have an undulated symmetric pattern. In certain alternative embodiments, the pattern of the cam rotor 505 may be skewed to favor rotation in one direction by modifying a slope of one side of an undulation, e.g., an increased falling slope. FIG. 5B illustrates one non-limiting example of the cam rotor 505 having a skewed pattern for a rotational direction 507. However, in the embodiment depicted in FIG. 5A, the pattern is not skewed, thereby presenting a tradeoff of torque for the ability to rotate in either direction with the same ease. Rotation may be created by electrically varying the current in the coils surrounding the magnetostrictive rods at 90° out of phase with each neighboring rod in steps of 90° around the ring.

The magnetostrictive rod assembly 510 may include a plurality of rods 515 positioned to be in contact with and/or proximate to the outer surface of the cam rotor 505. Each rod 515 may include any suitable piezoceramic, piezoelectric, electrostrictive, ferroelectric, relaxor ferroelectric, or magnetostrictive material that can be driven by an electrical or magnetic input and that provides a mechanical output in the form of a force or motion. When an electric or magnetic field is applied to such materials, the materials change shape in response to the applied field. These materials also usually respond to mechanical force or motion by generating an electric field which produces a voltage across its electrical connections, e.g., across electrodes, or a magnetic field which in turn may produce voltage across a conductor coiled around the materials.

In the example of the magnetostrictive rod assembly 510, the rods 515 may be disposed within a carriage 520, which may surround at least a portion of the rotor 505. In embodiments where the carriage 520 is fixed, the carriage 520 may be a stator. In certain embodiments, the motor 500 may further include a housing about the carriage 520, and the carriage 520 may be fixed to the housing.

As shown in FIG. 5A, a coil 525 may be coiled around each rod 515. The coils 525 may be in electrical connection with the power source 530. In certain embodiments, as shown in FIG. 5A, the control electronics 535 may also be in electrical connection with the power source 530 and the coils 525. The control electronics 535 may include phase balancing electronics and may be configured to drive the magnetostrictive rod assembly 510. By way of non-limiting example, control may be provided by controlling a frequency of excitation and/or drive amplitude. In varying embodiments, the control electronics 535 may include one or more of capacitors, inductors, and microprocessors, and may be used to balance the capacitance of the magnetostrictive rod assembly 510. In certain embodiments, the control electronics 535 may be used to create an electrical resonance. In certain embodiments, the electrical resonance is near the mechanical resonance of the system.

The shape changes of the piezoelectric or magnetostrictive materials of the rods 515 may be controlled by the application of electric or magnetic fields. For example, shape changes in the rods 515 may be induced by applying a voltage across the coils 525, and as the electric current flows through the coils 525, the rods 515 may change length accordingly. Such shape changes of the stator may be used to drive the cam rotor 505 to in turn drive the shaft 506.

In certain embodiments, the cam rotor 505 may be a single piece. In alternative embodiments, the cam rotor 505 may include a plurality of rotors, which may correspond to biasing structures of a rotary steerable tool. As depicted in the non-limiting example of FIG. 5A, the cam rotor 505 may include an inner rotor 505'. The inner rotor 505' may be elliptical as depicted. When the magnetostrictive rod assembly 510 rotates the cam rotor 505, the inner rotor 505' may also rotate. In a certain embodiment not shown, the inner rotor 505' may axially extend beyond the cam rotor 505 to accommodate an undulated portion of the inner rotor 505', where a second magnetostrictive rod assembly may directly drive the inner rotor 505' similar to the manner in which the magnetostrictive rod assembly 510 is configured to drive the cam rotor 505.

Figure 6:
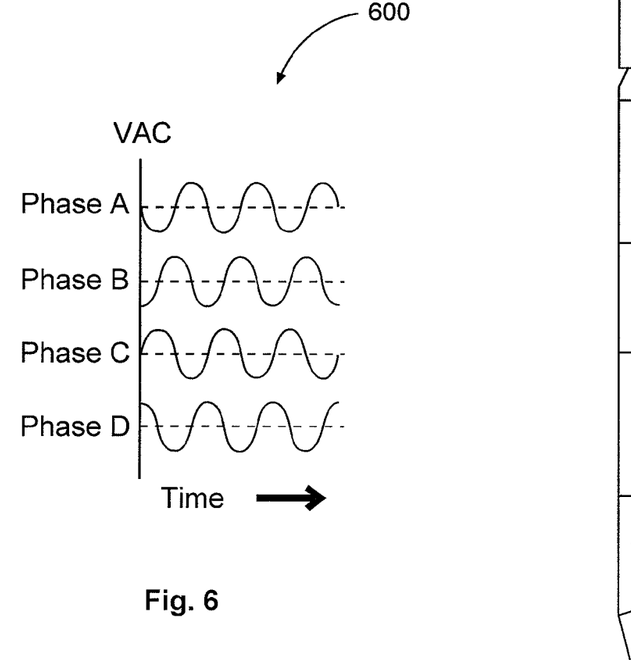
FIG. 6 is an exemplary graph of time-varying voltage applied to the four phases of the magnetostrictive motor of FIG. 5A, in accordance with certain exemplary embodiments of the present disclosure.

FIG. 6 shows an exemplary graph 600 of the time-varying voltage applied to the four phases of magnetostrictive motor 500. As the current flowing through the winding varies, corresponding lengths of proximate rods may vary due to the varying applied magnetic field. The control electronics 535 may be configured to coordinate the linear shape changes of the rods 515 with the undulation of the rotor 505 to thereby drive the rotor 505. By timing the extension and retraction of the length of the rod 515, force may be applied with the rod 515 to the flanking edges of the cam 505, resulting in a torque from the reaction to the thrust of the rod 515. By way of example without limitation, the balancing electronics 535 may induce a linear shape change in a given rod 515 just as a peak of the rotor 505 is reached or passes proximate to the rod 515.

The control electronics 535 may be configured to coordinate the linear shape changes according to phase, such as the Phases A-D. In certain embodiments, some compensation to the voltage may be necessary to compensate for non-linear responsiveness of the rods. A cam or shaft position sensor (not shown) can be used to track the position of the cam relative to the applied power phase to avoid timing problems with the rod actuation and used to monitor the speed, speed up or speed down of the motor. Accordingly, with the motor 500, one method of providing mechanical energy includes inducing shape changes in the magnetostrictive rod assembly 510 to ultimately drive the rotor 505.

In certain embodiments, a magnetostrictive motor according to the present disclosure may be used to power a local pump in a downhole application. In certain embodiments, a magnetostrictive motor may be coupled directly to a drill bit to enable rotational energy for drilling downhole. The required power may be obtained from the surface or from a downhole source. Using a Reelwell-like pipe-in-pipe drilling system may provide relatively large amounts of electrical power downhole by using the inner and outer pipe as a two-conductor power carrier. It should be understood that other means of supplying power, e.g., by use of cables or bands inter-connected along the length of the inside of the drill pipe, may be used. For low-power means, power can be generated locally from rotational and/or hydraulic power transmitted from surface or from energy stored in batteries or capacitors.

Figure 7:
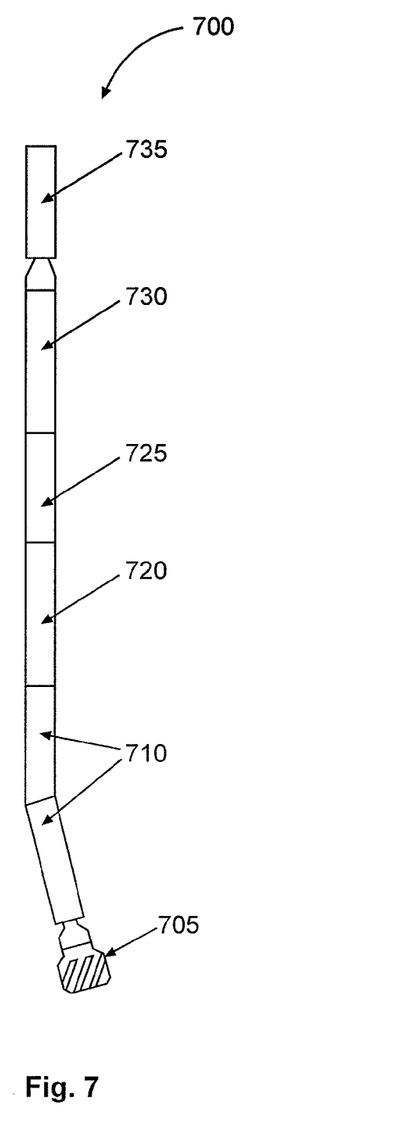
FIG. 7 is a diagram of a bottom hole assembly with a magnetostrictive motor powered orientor, in accordance with certain embodiments of the present disclosure.

FIG. 7 shows a bottom hole assembly 700 with a magnetostrictive motor powered orientor 735, in accordance with certain embodiments of the present disclosure. The magnetostrictive motor 500 may be implemented as a bottom hole assembly orientor where the bottom hole assembly 700 may be positioned so that a bent housing 710 on a mud motor 720 (e.g., a positive displacement motor) may be oriented to steer in a desired direction. Depicted in The bottom hole assembly 700 is one example of how the magnetostrictive motor 500 may be used to drive an orientor shaft in a bottom hole assembly. The cam 505 may be connected to the output shaft of the orientor 735 to rotate the bent housing 710 of the mud motor 720 in a desired direction. To drill in a straight manner, the motor 500 may allow the cam 505 to slowly slip by reducing the applied torque to the output shaft.

In certain embodiments, as illustrated in FIG. 8, the rotor may include a cam rotor 805 splined to a shaft 806. In the example of FIG. 8, the spines 808 may be designed to allow the cam rotor 805 to float over the shaft 806 while rotational energy is transferred via the spines 808. In certain example implementations, separating the cam rotor 805 from the shaft 806 may allow for control of the diameter variations while rotating the shaft 806. The shaft 806 may be exposed to forces, such as bending and twisting, which could cause the shaft 806 to flex. In such situations, separate rotor and shaft configurations may avoid or mitigate the possibility of the magnetostrictive rods being subjected to uneven compression cycles, which may even damage the rods. The splined arrangement may also allow the cam rotor 805 to slide over the shaft 806 while being torsionally coupled to the shaft 806. This allows the style of cam rotor to be changed depending on the need of a particular job. Thus, motor behavior may be modified by varying the slide on the rotor.

Figure 9:
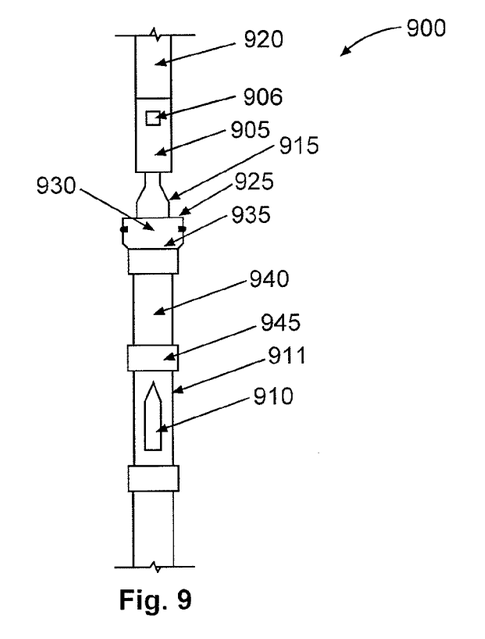
FIG. 9 is a diagram of a bottom hole assembly with a magnetostrictive motor to create a downhole torque to orient a pre-milled casing exit window in a desired direction, in accordance with certain embodiments of the present disclosure.

FIG. 9 shows a bottom hole assembly 900 with a magnetostrictive motor 905 to create a downhole torque to orient a pre-milled casing exit window 910 in a desired direction, in accordance with certain embodiments of the present disclosure. Since the magnetostrictive motor 905 has servo-like control features, the window 910 may be oriented in a desired direction. The magnetostrictive motor 905 may be coupled to a shaft 915. The example bottom hole assembly 900 may include various equipment such as a MWD and/or telemetry sub 920 coupled to the magnetostrictive motor 905, a liner hanger 925, a window joint 930, an internal latch 935, a liner 940, and a casing coupler 945. One or more shaft position sensors 906 may be coupled to the motor control system (not shown) of the motor 905 to track the position of the shaft 915 and alert the motor control system as to the orientation of the shaft 915, for example, relative the high side of the hole or the magnetic or true north direction. The one or more shaft position sensors 906 may include any suitable sensor and, by way of non-limiting example, may include magnetometers or gyroscopes for compass direction measurements.

The pre-milled casing exit window 910 may be part of a window assembly 911. The window assembly 911 may include a housing 912 with a longitudinal bore (not shown) extending therethrough, the window 910 extending through the exterior of the housing 912. The magnetostrictive motor 905 may rotate the pre-milled slot on the window joint 930. Since the magnetostrictive motor 905 is controlled by asserting electric power to magnetostrictive rods, the angular position of the shaft 915 can be positioned in a desirable angular orientation, thus allowing the window 910 to be positioned facing the desired exit direction. Once the window 910 is oriented correctly, the liner 940 and window 910 may be locked into position using the internal latch 935 or any of various suitable latches, packers or other hang-off mechanisms. It should be understood that various types of equipment such as the may be used to assist in positioning the window 910 at a desired orientation, with the magnetostrictive motor 905 providing the driving force for movement of the window 910. It also should be understood that the window 910, locked into position, then allows for exiting the main bore into a lateral bore with a bit on a whip stock according to conventional practices.

Accordingly, certain embodiments of the present disclosure provide for a magnetostrictive motor that rotates eccentric rings in a bias unit of a rotary steerable tool, a magnetostrictive motor as a bottom hole assembly orientor, a magnetostrictive motor to create a down hole torque to orient a multi-lateral pre-milled window such that it is oriented in the desired direction for exiting the main bore into the lateral with the bit on a whip stock, and a magnetostrictive motor to create a down hole torque for drilling. Moreover, certain embodiments of the magnetostrictive rod motor may be used in other applications where rotational power via electric current is needed.

And even though the figures depict embodiments of the present disclosure in a particular orientation, it should be understood by those skilled in the art that embodiments of the present disclosure are well suited for use in a variety of orientations. Accordingly, it should be understood by those skilled in the art that the use of directional terms such as above, below, upper, lower, upward, downward and the like are used in relation to the illustrative embodiments as they are depicted in the figures, the upward direction being toward the top of the corresponding figure and the downward direction being toward the bottom of the corresponding figure.

Therefore, the present invention is well adapted to attain the ends and advantages mentioned as well as those that are inherent therein. The particular embodiments disclosed above are illustrative only, as the present invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular illustrative embodiments disclosed above may be altered or modified and all such variations are considered within the scope and spirit of the present invention. Also, the terms in the claims have their plain, ordinary meaning unless otherwise explicitly and clearly defined by the patentee. The indefinite articles "a" or "an," as used in the claims, are defined herein to mean one or more than one of the element that that a particular article introduces; and subsequent use of the definite article "the" is not intended to negate that meaning.

What is claimed is:

1. A motor, comprising:
    a housing;
    a rotor comprising an undulated surface with a skewed pattern;
    an adjustable portion of the housing, wherein the rotor is drivingly coupled to the adjustable portion to orient the adjustable portion;
    a rod disposed about the rotor; and
    a coil disposed about the rod to induce shape changes in the rod, which in turn impart forces to the undulated surface to rotate the rotor.

2. The motor of claim 1, wherein the undulated surface comprises a symmetrical pattern.

3. The motor of claim 1, wherein the forces rotate the rotor in a predetermined direction.

4. The motor of claim 1, wherein the shape changes impart forces to the undulated surface to rotate the rotor in a first direction with a plurality of phases.

5. The motor of claim 1, wherein the shape changes impart forces to the undulated surface to selectively rotate the rotor in one of a first direction and a second direction.

6. The motor of claim 1, wherein the rotor, the rod, and the coil and the rod assembly are usable in a wellbore.

7. A bottom hole assembly, comprising:
    a housing and a shaft disposed therein;
    a rotor coupled to the shaft and comprising an undulated surface with a skewed pattern;
    an adjustable portion of the housing, wherein the rotor is drivingly coupled to the adjustable portion to orient the adjustable portion;
    a magnetostrictive rod disposed in a rod housing about the undulated surface, the magnetostrictive rod having an end disposed adjacent to the undulated surface; and
    a winding arrangement disposed at least partially about the magnetostrictive rod to induce a series of shape changes in the magnetostrictive rod, wherein the series of shape changes imparts forces to the undulated surface.

8. The bottom hole assembly of claim 7, wherein the shaft is drivingly coupled to a drill bit, and the rotor rotates the drill bit.

9. The bottom hole assembly of claim 7, wherein orienting the adjustable portion steers the housing in a wellbore.

10. The bottom hole assembly of claim 7, wherein the undulated surface comprises a symmetrical pattern.

11. The bottom hole assembly of claim 7, wherein the magnetostrictive rod and the undulated surface favor a direction of rotation of the rotor.

12. The bottom hole assembly of claim 7, wherein the shape changes impart forces to the undulated surface to rotate the rotor with a plurality of phases.

13. A method of providing rotational force, the method comprising:
 providing a motor comprising:
  a rotor comprising an undulated surface with a skewed pattern;
  a rod disposed about the rotor; and
  a coil disposed about the rod to generate a varying field that induces shape changes in the rod, which in turn impart forces to the undulated surface that rotate the rotor;
 providing a housing and a shaft disposed therein, the shaft coupled to the rotor; and
 inducing shape changes in the rod to rotate the rotor and the shaft;
 providing the motor in a bottom hole assembly, with the rotor and shaft drivingly coupled to an adjustable portion of the housing;
 wherein the step of inducing shape changes in the rod to rotate the rotor and the shaft comprises inducing shape changes in the rod to orient the adjustable portion.

14. The method of providing rotational force of claim 13, further comprising:
 providing the motor in a bottom hole assembly, with the rotor and shaft drivingly coupled to a drill bit;
 wherein the step of inducing shape changes in the rod to rotate the rotor and the shaft comprises inducing shape changes in the rod to rotate the drill bit.

15. The method of providing rotational force of claim 13, wherein inducing shape changes in the rod to orient the adjustable portion steers the bottom hole assembly in a wellbore.

16. The method of providing rotational force of claim 13, wherein the shape changes impart forces to the undulated surface to rotate the rotor with a plurality of phases.

\* \* \* \* \*